(12) United States Patent
Yuen

(10) Patent No.: US 7,049,891 B2
(45) Date of Patent: May 23, 2006

(54) AMPLIFIER BIAS ENHANCEMENT TECHNIQUE

(75) Inventor: Gregory Yuen, Harlow (GB)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 10/843,441

(22) Filed: May 12, 2004

(65) Prior Publication Data

US 2005/0253655 A1    Nov. 17, 2005

(51) Int. Cl.
   *H03G 3/10*    (2006.01)
(52) U.S. Cl. ........................................ 330/285; 330/296
(58) Field of Classification Search .................. 330/285, 330/296, 288, 290, 298, 207 P; 323/315, 323/316
   See application file for complete search history.

(56) References Cited

U.S. PATENT DOCUMENTS

| | | | | |
|---|---|---|---|---|
| 5,808,515 A | * | 9/1998 | Tsuruoka et al. | 330/277 |
| 5,986,509 A | * | 11/1999 | Lohninger | 330/290 |
| 6,515,546 B1 | | 2/2003 | Liwinski | |
| 6,720,831 B1 | * | 4/2004 | Dening et al. | 330/298 |
| 6,794,935 B1 | * | 9/2004 | Klomsdorf et al. | 330/129 |
| 2004/0000954 A1 | | 1/2004 | Kim et al. | |

FOREIGN PATENT DOCUMENTS

WO    WO 01/43277 A1    6/2001

* cited by examiner

*Primary Examiner*—Henry Choe
(74) *Attorney, Agent, or Firm*—Kenyon & Kenyon LLP

(57) ABSTRACT

A bias boost circuit is disclosed for use with an amplifier circuit for biasing thereof. The amplifier circuit includes at least a first transistor and a filter circuit for filtering of current pulses received from the bias boost circuit, where filtered current pulses form a variable bias current that is provided to the at least a first transistor. With this type of biasing circuit, large input signals that would normally compress the gain of the amplifier circuit are therefore amplified with less gain compression by virtue of the boost in bias current that is supplied to the at least a first transistor.

14 Claims, 2 Drawing Sheets

AMPLIFIER BIAS ENHANCEMENT TECHNIQUE

FIELD OF THE INVENTION

The invention relates to the field of amplifier circuits and more specifically to the field of bias boost circuits for use with amplifier circuits.

BACKGROUND OF THE INVENTION

RF power amplifiers (PAs) are typically used for propagating amplitude and phase information for a RF input signal in an accurate manner so as not to corrupt data being transmitted within the RF signal. Generally, in order to attain this accuracy, a large bias current is used to bias the PA at an operating point with sufficient gain and bandwidth. Unfortunately, in battery-operated equipment, this large bias current is not conducive to long battery life, it is also not conducive to optimum linearity and to low noise operation.

Low noise amplifiers (LNA) are typically biased at a fixed current for minimum noise operation so that small amplitude input signals are detectable. In determining the bias point for an active device performing signal amplification, there is a trade-off between noise figure (Fmin) expressed as dB and other amplifier figures of merit. However, where the active LNA device is in close proximity to the transmitter, for example as in an antenna-coupled LNA, situations may arise where the input signal provided to the input port of the LNA causes overload because it has a high signal power. LNAs typically have low gain, but, often do not have the low noise performance when biased for best linearity. Conversely, they often do not have best linearity when biased for lowest noise. PAs on the other hand, typically have low gain when deliberately biased at low currents. It is known to those of skill in the art of PA design, that PAs are sometimes deliberately biased at low currents and rely on an autobias effect from the signal to achieve overall linearity. That is, the magnitude of the input signal to the amplifier actually influences the bias point of the amplifying transistor so as to improve linearity. Stronger input signals increase the bias current of the amplifying transistor. This effect, however, is limited and there exists a need to provide a means to enhance the autobias effect and improve linearity with even stronger input signals.

It is an objective of this invention to augment the autobias effect by providing bias-boost circuitry that is effectively autobiased by the output signal of the amplifying transistor.

SUMMARY OF THE INVENTION

In accordance with the invention there is provided a circuit comprising: an amplifier circuit having a gain and an input port for receiving of a RF input signal and having an output port for providing of a RF output signal, the amplifier circuit comprising: an amplifying portion including at least a first transistor coupled with the input port and with the output port for receiving of the RF input signal and for providing an amplified version of the RF input signal as the RF output signal at the output port; a bias boost circuit coupled with the amplifying circuit for biasing of the amplifying transistor comprising; and, a bias boost circuit coupled with the at least a first transistor for providing a variable bias current to the at least a first transistor in dependence upon a signal power of the RF output signal.

In accordance with the invention there is provided a method of increasing an auto bias effect for an amplifier circuit comprising: receiving of a RF input signal; providing an amplifier circuit having at least a first transistor; providing a bias boost circuit for providing a variable bias current; amplifying of the RF input signal using the amplifier circuit and the at least a first transistor to form a RF output signal; receiving a portion of the RF output signal; and, biasing of the at least a first transistor of the amplifier circuit using the variable bias current in dependence upon the received portion of the RF output signal power.

In accordance with the invention there is provided a method of increasing an auto bias effect for an amplifier circuit comprising: receiving of a RF input signal; providing an amplifier circuit having at least a first transistor and a biasing circuit for biasing of the first transistor; providing a bias boost circuit for providing a variable bias current; amplifying of the RF input signal using the amplifier circuit and the at least a first transistor to form a RF output signal; using a portion of the RF output signal to autobias the biasing circuit for biasing of the amplifying transistor; and, biasing of the at least a first transistor of the amplifier circuit using the bias boost circuit that is autobiased by the portion of the signal power of the RF output signal.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
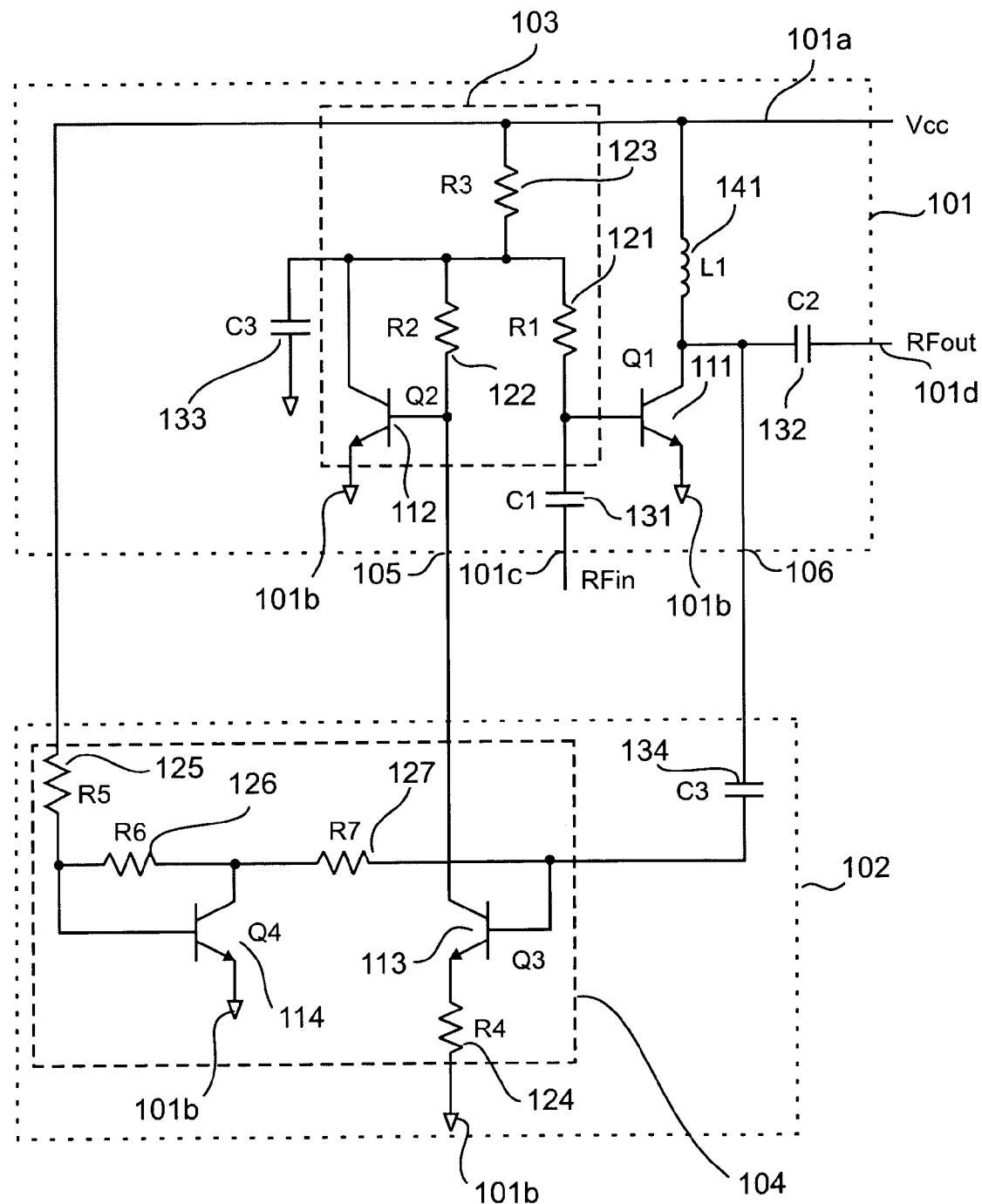
FIG. 1 illustrates a state of the art amplifier circuit as well as a bias boost circuit in accordance with an embodiment of the invention.

FIG. 1 illustrates a state of the art amplifier circuit 101 as well as a bias boost circuit 102, in accordance with an embodiment of the invention. A first transistor Q1 111 is the predominant amplification transistor and is used for amplifying of a RF input signal that is received from an input port 101c to form an amplifier version of the input signal as a RF output signal at an output port 101d. A coupling capacitor C1 131 is used to couple of this RF input signal to the base terminal of transistor Q1 111. Optionally, a more advanced coupling network is disposed between the base terminal of transistor Q1 111 and the input port 101c for coupling of the RF input signal.

Choke L1 141 is disposed between the collector terminal of transistor Q1 111 and the first supply voltage port 101a. This choke L1 141 provides a high impedance path to the collector terminal of transistor Q1 111. Capacitor C2 132 is disposed between the collector terminal of transistor Q1 111 and the output port 101d for capacitively coupling of the RF output signal. Optionally, a more advanced coupling network is disposed between the collector terminal of transistor Q1 111 and the output port 101d for coupling of the RF output signal to the output port 101d.

Resistor R2 122 is disposed between the base and collector terminals of a second transistor Q2 112, where the emitter terminal thereof is coupled with the second supply voltage port 101b. Capacitor C3 133 is disposed between the second supply voltage port 101b and the collector terminal of transistor Q2 112. Resistor R3 123 couples the first supply voltage port 101a with the collector terminal of transistor Q2 112. Resistor R1 121 couples the collector terminal of transistor Q2 112 with the base terminal of transistor Q1 111. A first coupling 105 is used for coupling of the bias boost circuit 102 to the base terminal of transistor Q2 112 and a second coupling 106 is used for coupling of the bias boost circuit 102 to the collector terminal of transistor Q1 111 for receiving a capacitively coupled portion of the RF output signal.

Within the bias boost circuit 102, resistor R5 125 is used for coupling of the base terminal of transistor Q4 112 to the first supply voltage port 101a. Resistor R6 126 is disposed between the collector and base terminals of transistor Q4 114, where the emitter terminal thereof is coupled with the second supply voltage port 101b. Resistor R7 127 is used to couple of the collector terminal of transistor Q4 114 to the base terminal of transistor Q3 113, where the emitter terminal thereof is coupled with the second supply voltage port 101b with resistor R4 124. The collector terminal of transistor Q3 113 is coupled to the base terminal of transistor Q2 112 along the first coupling 105. Capacitor C4 134 is coupled to the emitter terminal of transistor Q1 111 along the second coupling 106.

Transistor, Q2 112, and resistors R1 121, R2 122 and R3 123 form a DC bias circuit 103 for transistor Q1 111, which is a first current mirror circuit. Transistor Q2 112 is the reference device and transistor Q1 111 is the mirror device. Within the bias boost circuit 102, transistors Q3 113 and Q4 114, as well as resistors R4 124, R5 125, R6 126 and R7 127 form a second current mirror circuit 104, where transistor Q4 114 is a reference transistor and transistor Q3 113 acts as the current mirror. This arrangement of the circuit components within the bias boost circuit 102 facilitates the generation of very small currents in transistor Q3 113 without the use of high value resistances for resistors R4 124, R5 125, R6 126 and R7 127.

In use of the circuit 100, the operating current of transistor Q1 111 is determined from operating parameters, such as those related to gain, noise figure and compression. Resistor R1 121 is selected to provide a moderate to high impedance for the RF input signal that is coupled into the circuit 101 by capacitor C1 131 but at the same time for exhibiting a small DC voltage drop due to a bias current. As per first current mirror design, resistors R1 121 and R2 122 are sized in an inverse ratio to transistor Q1 111 and Q2 112 emitter areas. Resistor R3 123 is used to set the operating current for both transistors Q1 111 and Q2 112.

For no RF input signal being provided to the input port 101c, current propagating through transistor Q3 113 is set to be smaller than the current that is propagating through transistor Q2 112. A small current that propagates through transistor Q4 114 is determined by selecting a resistance value for resistor R5 125. By coupling resistor R6 126 between the base and collector terminals of transistor Q4 114, the collector current that flows through this transistor further reduces the voltage on the base terminal of transistor Q3 113. The emitter resistor R4 124 of transistor Q3 113 is used for further reducing its base and emitter terminal voltage (VBE) and hence it's current. Capacitor C4 134 and resistor R7 127 form a RF signal potential divider so the signal that is delivered to the base terminal of transistor Q3 113 has a predetermined signal amplitude in relation to a signal amplitude on the collector terminal of transistor Q1 111. Since transistor Q3 113 operates with a small current, a DC voltage drop across resistor R7 127 is small. Furthermore, current in transistor Q3 113 is further reduced by sizing the emitter area of transistor Q4 114 larger than that of transistor Q3 113.

Figure 2A:
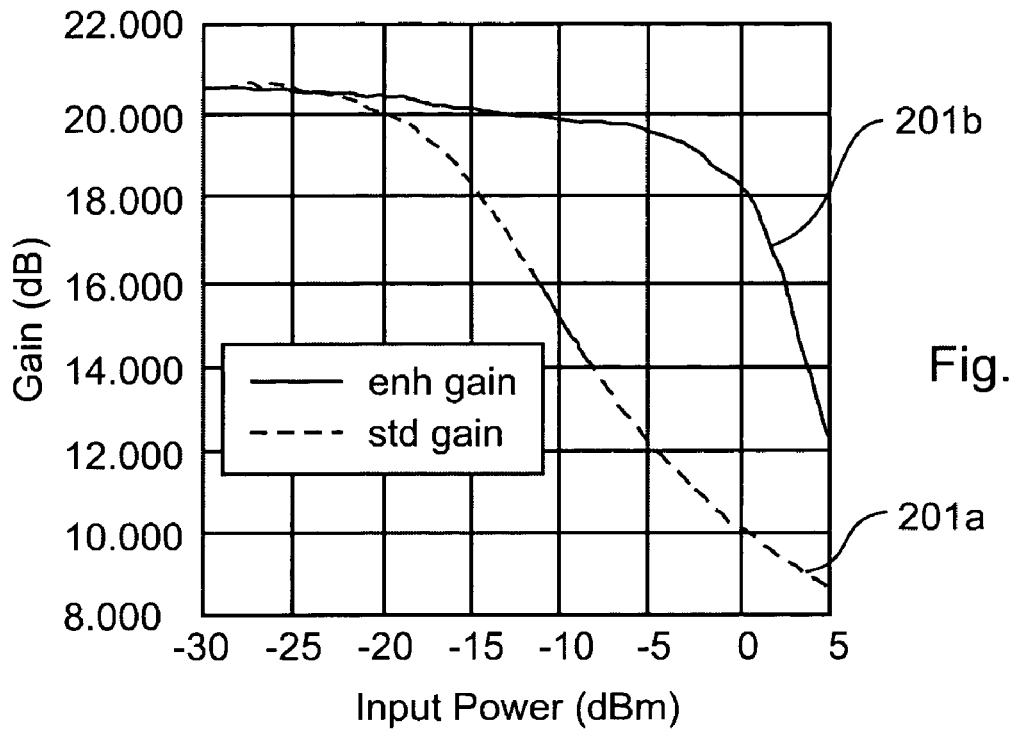
FIG. 2a illustrates a graph of gain vs input power for the amplifier circuit without the bias boost circuit shown in FIG. 1 and with the bias boost circuit shown in FIG. 1; and, FIG. 2b illustrates a graph of supply current vs input power for the amplifier circuit without the bias boost circuit shown in FIG. 1 and with the bias boost circuit shown in FIG. 1.
Figure 2B:
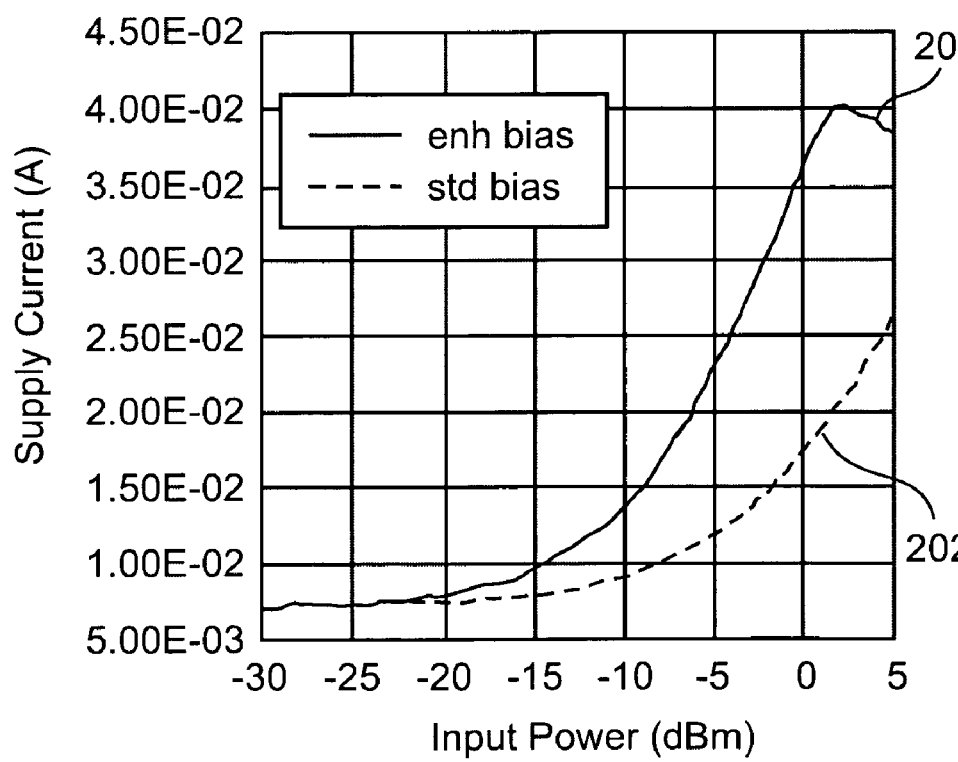

FIG. 2a illustrates a graph of amplifier circuit gain, in dB, vs RF signal input power, in dBm, and FIG. 2b illustrates a graph of supply current, in Amps, vs RF signal input power, in dBm. Both figures illustrate traces for the standard amplifier circuit 101 with the bias boost circuit 102 coupled therewith and not coupled therewith. Without the bias boost circuit 102 coupled with the amplifier circuit 101, traces 201a and 202a result. With the bias boost circuit 102 coupled with the amplifier circuit 101, traces 201b and 202b result. As is shown in FIG. 2b, there is a signal dependent auto bias effect as the supply current provided to the supply voltage ports, 101a and 101b, rises from about 7 mA to 17 mA at 0 dBm.

With the bias boost circuit 102 coupled to the amplifier circuit 101, a negative signal excursions on the base terminal of transistor Q3 113 does little to affect the amplifier circuit 101 because transistor Q3 113 is biased near cutoff. However, positive signal excursions on the base terminal of transistor Q3 113 causes the collector terminal of transistor Q3 113 to act as a pulsed current sink. This causes transistor Q2 112 to conduct less current in synchronization with current pulses received by transistor Q3 113. The average voltage on the collector terminal of transistor Q2 112 thus rises and there is a larger current available through resistor R1 121. A filter circuit is provided that includes capacitor C3 133 for filtering the current pulses so that the net effect is that transistor Q1 111 is biased with an augmented DC bias current that is larger than those currents arising from the autobias effect, as the RF input signal level is increased. This effect is observed in the trace 202b. This increased current results in a flatter gain being maintained for higher RF input signal power levels, as trace 201b depicts.

A common figure of merit for measuring of amplifier circuit performance is the 1 dB compression point. For a standard bias boost circuit, this 1 dB compression point is at approximately −19 dBm. For the bias boost circuit 102, this 1 dB compression point is at approximately −6 dBm. This advantageously provides an approximately 20 times increase in RF signal output power with no change in quiescent current and approximately 20.6 mA current drain at approximately −6 dBm RF signal input power, where the current drain for a standard bias is approximately 11.2 mA.

Using a normal auto bias effect for the amplifier circuit 101, without the bias boost circuit 102 coupled therewith, and starting from a low-bias current, it is possible to achieve linearity—flat gain over large dynamic range—at the expense of low gain. Using the bias boost circuit 102 in accordance with the embodiment of the invention, biasing at high current is performed in order to achieve both improved gain and improved flatness. This advantageously allows for designing of amplifier circuits with fewer RF gain stages, which potentially provides for improved management of ground currents and instability issues. For typically RF amplifier circuit design, it is preferred to increase the complexity of the bias boost circuits that are used for biasing of the amplifier circuit rather than to introduce complexity to the circuitry in the RF domain.

Although a single stage is shown for the amplifier circuit of FIG. 1, the use of the auto bias boost circuit 102 is also applicable to multi-stage amplifier circuits. Although NPN transistors are shown, the technique also operates with FETs.

Additionally, different circuit topologies are envisaged for performing of the biasing if PMOS or NMOS FETs, or PNP transistors are utilized.

Typically, when designing of RF amplifier circuits, in adjusting of one parameter, such as compression or gain, the other parameter is adversely affected. The embodiment of the invention advantageously allows for presetting of gain and compression independently, thus reducing repetitive optimization, which is typically performed in the art of RF amplifier circuit design. Further advantageously, for large amplitude RF input signals that would normally compress the gain of the amplifier circuit 101, these signals are amplified with less gain compression because of the boost in bias current supplied to transistor Q1 111 from the bias boost circuit 102.

Advantageously, as the bias signal from the bias boost circuit is autobiased by the RF output signal from the collector terminal of transistor Q3, it provides an effective increase in the bias current that is provided to transistor Q1. Moreover the increase in bias current provided to transistor Q1 exceeds that which would normally be provided relying solely on the conventional autobias effect.

Numerous other embodiments may be envisaged without departing from the spirit or scope of the invention.

What is claimed is:

1. A circuit comprising:
   an amplifier circuit having a gain and an input port for receiving of a RF input signal and having an output port for providing of a RF output signal, the amplifier circuit comprising:
   an amplifying portion including at least a first transistor coupled with the input port and with the output port for receiving of the RF input signal and for providing an amplified version of the RF input signal as the RF output signal at the output port;
   a bias boost circuit coupled with the amplifying circuit for biasing of the first transistor comprising;
   a bias boost circuit coupled with the at least first transistor for providing a variable bias current to the at least first transistor in dependence upon a signal power of the RF output signal;
   circuitry for providing current pulses that vary in magnitude in proportion to the signal power of the RF output signal to one of base and gate terminals of the at least first transistor; and,
   a filter circuit coupled with the at least first transistor and the bias boost circuit for filtering the current pulses to provide an augmented DC bias current to the one of a gate and a base terminal of the at least first transistor that is higher than a bias current resulting from an autobias effect for the at least first transistor.

2. A circuit according to claim 1, wherein the amplifier circuit comprises a DC bias circuit coupled with the filter circuit and the at least first transistor for biasing of the at least first transistor with a DC current.

3. A circuit according to claim 2, wherein the DC bias circuit comprises a first current mirror circuit that comprises a second transistor, where the second transistor is a current reference device and the at least first transistor is a current mirror device.

4. A circuit according to claim 2, wherein the DC bias circuit comprises:
   a first resistor; and,
   a second resistor;
   wherein the first and second resistors are sized in an inverse ratio to emitter areas of the at least first transistor and the second transistor.

5. A circuit according to claim 3, wherein the DC bias circuit comprises a third resistor coupled with the at least first transistor and the second transistor for determining an operating current for the at least first transistor and the second transistor.

6. A circuit comprising:
   an amplifier circuit having a gain and an input port for receiving of a RF input signal and having an output port for providing of a RF output signal, the amplifier circuit comprising:
   an amplifying portion including at least a first transistor coupled with the input port and with the output port for receiving of the RF input signal and for providing an amplified version of the RF input signal as the RF output signal at the output port;
   a bias boost circuit coupled with the amplifying circuit for biasing of the first transistor comprising; and,
   a bias boost circuit coupled with the at least first transistor for providing a variable bias current to the at least first transistor in dependence upon a signal power of the RF output signal;
   a third transistor;
   a second transistor; and
   a fourth resistor coupled with an emitter terminal of the third transistor for reducing a base emitter voltage of the third transistor
   wherein the bias boost circuit comprises the third transistor, wherein the third transistor is biased in such a manner that it propagates less current than the second transistor, when in use.

7. A circuit, comprising:
   an amplifier circuit having a gain and an input port for receiving of a RF input signal and having an output port for providing of a RF output signal, the amplifier circuit comprising:
   an amplifying portion including at least a first transistor coupled with the input port and with the output port for receiving of the RF input signal and for providing an amplified version of the RF input signal as the RF output signal at the output port;
   a bias boost circuit coupled with the amplifying circuit for biasing of the amplifying transistor comprising; and,
   a bias boost circuit coupled with the at least first transistor for providing a variable bias current to the at least first transistor in dependence upon a signal power of the RF output signal;
   a third transistor;
   the bias boost circuit comprising a RF signal potential divider circuit for providing a predetermined signal amplitude to a base terminal of the third transistor in relation to a signal amplitude that is provided on a collector terminal of the at least first transistor.

8. A method of increasing an auto bias effect for an amplifier circuit comprising:
   receiving of a RF input signal;
   providing an amplifier circuit having at least a first transistor;
   providing a bias boost circuit for providing a variable bias current;
   amplifying of the RF input signal using the amplifier circuit and the at least first transistor to form a RF output signal;
   receiving a portion of the RF output signal; and,
   biasing of the at least first transistor of the amplifier circuit using the variable bias current in dependence upon the received portion of the RF output signal power, wherein biasing of the at least first transistor comprises:

providing pulsed current from the bias boost circuit; and,
filtering of the pulsed current to provide the variable bias current to the at least first transistor.

9. A method according to claim 8, wherein the variable bias current is higher than that of the autobias effect for the at least first transistor.

10. A method according to claim 8, wherein for higher RF input signal powers a flatter gain is maintained for the amplifier circuit when it is biased using the bias boost circuit as compared to when the amplifier circuit is autobiased.

11. A method according to claim 8, comprising providing a third transistor disposed within the bias boost circuit and coupled with the at least first transistor for providing of the current pulses thereto, wherein the third transistor is biased near cutoff.

12. A method according to claim 11, comprising providing of positive signal excursion to a base terminal of the third transistor for operating the third transistor as a pulsed current sink.

13. A method of increasing an auto bias effect for an amplifier circuit, comprising:
receiving of a RF input signal;
providing an amplifier circuit having at least a first transistor;
providing a bias boost circuit for providing a variable bias current;
amplifying of the RE input signal using the amplifier circuit and the at least first transistor to form a RF output signal;
receiving a portion of the RF output signal;
biasing of the at least first transistor of the amplifier circuit using the variable bias current in dependence upon the received portion of the RF output signal power,
providing a third transistor disposed within the bias boost circuit and coupled with the at least first transistor for providing of current pulses thereto, wherein the third transistor is biased near cutoff;
providing of positive signal excursion to a base terminal of the third transistor for operating the third transistor as a pulsed current sink;
providing of a second transistor within the amplifier circuit coupled with the at least a first transistor; and,
synchronizing operation of the second transistor with the third transistor,
wherein the second transistor conducts a decreased current when in synchronization with the current pulses received by the third transistor.

14. A method according to claim 13, comprising:
increasing of a potential on one of a collector and emitter terminal of the second transistor; and,
increasing of a current available to the at least first transistor, wherein this current is filtered for providing the increased DC bias to the at least first transistor.

* * * * *